United States Patent
Chyi et al.

(10) Patent No.: US 8,524,583 B2
(45) Date of Patent: Sep. 3, 2013

(54) METHOD FOR GROWING SEMIPOLAR NITRIDE

(75) Inventors: Jen-Inn Chyi, Taoyuan (TW); Hsueh-Hsing Liu, Taoyuan (TW); Hsien Yu Lin, Taoyuan (TW)

(73) Assignee: National Central University, Jung-li, Taoyuan (TW)

( * ) Notice: Subject to any disclaimer, the term of this patent is extended or adjusted under 35 U.S.C. 154(b) by 194 days.

(21) Appl. No.: 13/177,330

(22) Filed: Jul. 6, 2011

(65) Prior Publication Data

US 2012/0276722 A1    Nov. 1, 2012

(30) Foreign Application Priority Data

Apr. 27, 2011  (TW) .............................. 100114580 A

(51) Int. Cl.
   *H01L 21/205*    (2006.01)
(52) U.S. Cl.
   USPC ................................... 438/504; 257/E21.109
(58) Field of Classification Search
   None
   See application file for complete search history.

(56) References Cited

U.S. PATENT DOCUMENTS

| 7,727,874 B2 * | 6/2010 | Hanser et al. ................. 438/604 |
| 8,183,071 B2 * | 5/2012 | Akita et al. ..................... 438/31 |
| 2010/0176375 A1 * | 7/2010 | Lochtefeld ...................... 257/14 |
| 2011/0227198 A1 * | 9/2011 | Wunderer et al. ............ 257/615 |

FOREIGN PATENT DOCUMENTS

JP    2008305977    12/2008

* cited by examiner

*Primary Examiner* — Seahvosh Nikmanesh
(74) *Attorney, Agent, or Firm* — Muncy, Geissler, Olds & Lowe, PLLC

(57) ABSTRACT

A method for growing a semipolar nitride comprises steps: forming a plurality of parallel discrete trenches on a silicon substrate, each discrete trenches having a first wall and a second wall, wherein a tilt angle is formed between the surface of the silicon substrate and the first wall; forming a buffer layer on the silicon substrate and the trenches, wherein the buffer layer on the first wall has a plurality of growing zones and a plurality of non-growing zones among the growing zones and complementary to the growing zones; forming a cover layer on the buffer layer and revealing the growing zones; and growing a semipolar nitride from the growing zones of the buffer layer and covering the cover layer. Thereby cracks caused by thermal stress between the silicon substrate and semipolar nitride are decreased and the quality of the semipolar nitride film is improved.

10 Claims, 6 Drawing Sheets

METHOD FOR GROWING SEMIPOLAR NITRIDE

FIELD OF THE INVENTION

The present invention relates to a semipolar nitride, particularly to a method for growing a semipolar nitride.

BACKGROUND OF THE INVENTION

As LED (Light Emitting Diode) features environment-friendliness, high power-efficiency, lightweight, long service life, low operating voltage and high impact-resistance, it has gradually replaced the conventional fluorescent lamp and incandescent lamp and widely applied to head lights, direction lights, indicator lights, illuminators and displays. In the existing technology, LED is a solid-state element, which is primarily made of nitrides having a direct band gap and high breakdown voltage. The GaN (gallium nitride) LED is conventionally grown on the c-plane. However, the intrinsic electric field thereof deflects the structure of the QW (Quantum Well) energy band and decreases the probability of the overlap of the wave functions of electrons and holes. Thus the light emitting efficiency of LED is reduced. Therefore, the manufacturers desire to develop a semipolar GaN free of intrinsic electric field so as to increase the internal quantum efficiency of LED.

A Japan Publication No. 2008305977 disclosed a technology for growing semipolar GaN on a silicon substrate. In the prior art, ridged periodic mask patterns made of silicon dioxide are defined parallel to <−110> direction on a 7-degree off (001) silicon substrate.

Next, a KOH solution is used to etch the silicon substrate to form grooves having two inclined faces, wherein one of the two inclined faces is a (111) crystallographic plane intersecting with the primary plane of the silicon substrate, and the other is a (−1-11) crystallographic plane intersecting with the primary plane of the silicon substrate. Next, silicon dioxide covers on the silicon substrate except the (111) crystallographic plane, and a GaN film is grown on the (111) crystallographic plane with the (1-101) crystallographic plane of the GaN film on the (111) crystallographic plane of the silicon substrate. Thereby a semipolar GaN film is formed. However, there is lattice mismatch existing between the GaN film and the (111) crystallographic plane. Further, there is great difference of the thermal expansion coefficients thereof Thus about −50% tensile stress is generated that usually causes the semipolar GaN film to crack along the <110> direction.

SUMMARY OF THE INVENTION

The primary objective of the present invention is to decrease cracks of a semipolar GaN film, which are generated by thermal stress between a GaN film and a silicon substrate.

Another objective of the present invention is to reduce defects of a GaN film and increase the quality of the GaN film.

To achieve the abovementioned objectives, the present invention proposes a method for growing a semipolar nitride, which comprises steps: forming a plurality of trenches on a silicon substrate, each trench having a first wall and a second wall, wherein a tilt angle is form between the first wall and the surface of the silicon substrate; forming a buffer layer on the silicon substrate and the trenches, wherein the buffer layer on each first wall has a plurality of growing zones and a plurality of non-growing zones among the growing zones and complementary to the growing zones; forming a cover layer on the buffer layer, the cover layer covering the non-growing zones but revealing the growing zones; and growing a semipolar nitride from the growing zones of the buffer layer such that the semipolar nitride overlay the cover layer.

The present invention is characterized in defining discrete regions of the first wall as the growing zones, assigning the rest of the first wall as the non-growing zones, and epitaxially growing a semipolar nitride on the discrete growing zones. Thereby the size of each growing zone where the semipolar nitride is bonded to the buffer layer is reduced. Thus the cracks induced by thermal stress and lattice mismatch are decreased. Therefore the quality of a semipolar nitride film can be increased.

DETAILED DESCRIPTION OF THE PREFERRED EMBODIMENTS

The technical contents of the present invention are described in detail in cooperation with the drawings below.

Refer to FIGS. 1A-1F showing schematic view of a process to fabricate a semipolar nitride according to one embodiment of the present invention. The present invention proposes a method for growing a semipolar nitride comprising the following processes.

Figure 1A:
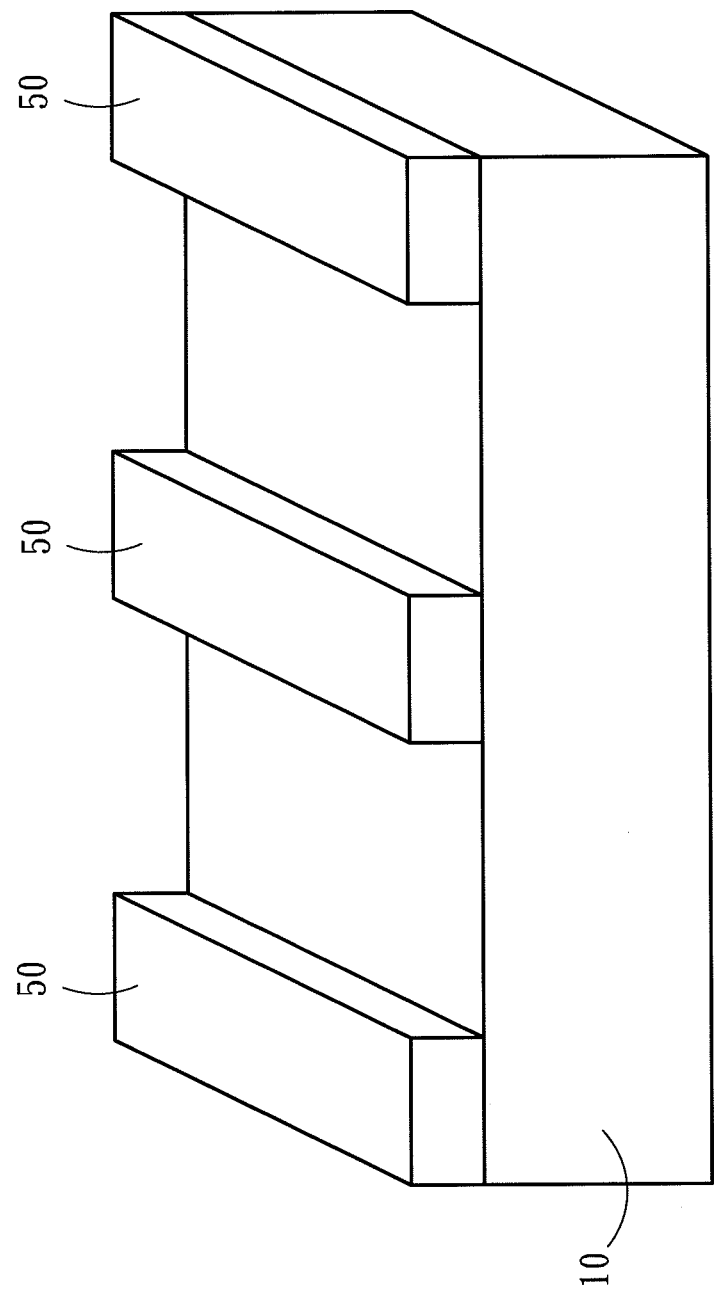
FIGS. 1A-1F showing schematic views of a process to fabricate a semipolar nitride according to one embodiment of the present invention.

Refer to FIG. 1A. Firstly, a mask having a plurality of periodic patterns 50 is formed on a silicon substrate 10, wherein an angle of 5-10 degrees is form between the surface of the silicon substrate 10 and the (001) crystallographic plane thereof. This embodiment adopts a 7-degree off (001) silicon substrate and defines a plurality of strip-like periodic patterns 50 parallel to the <−110> direction on the silicon substrate 10 by a photolithographic process, wherein the patterns 50 are made of silicon dioxide.

Figure 1B:
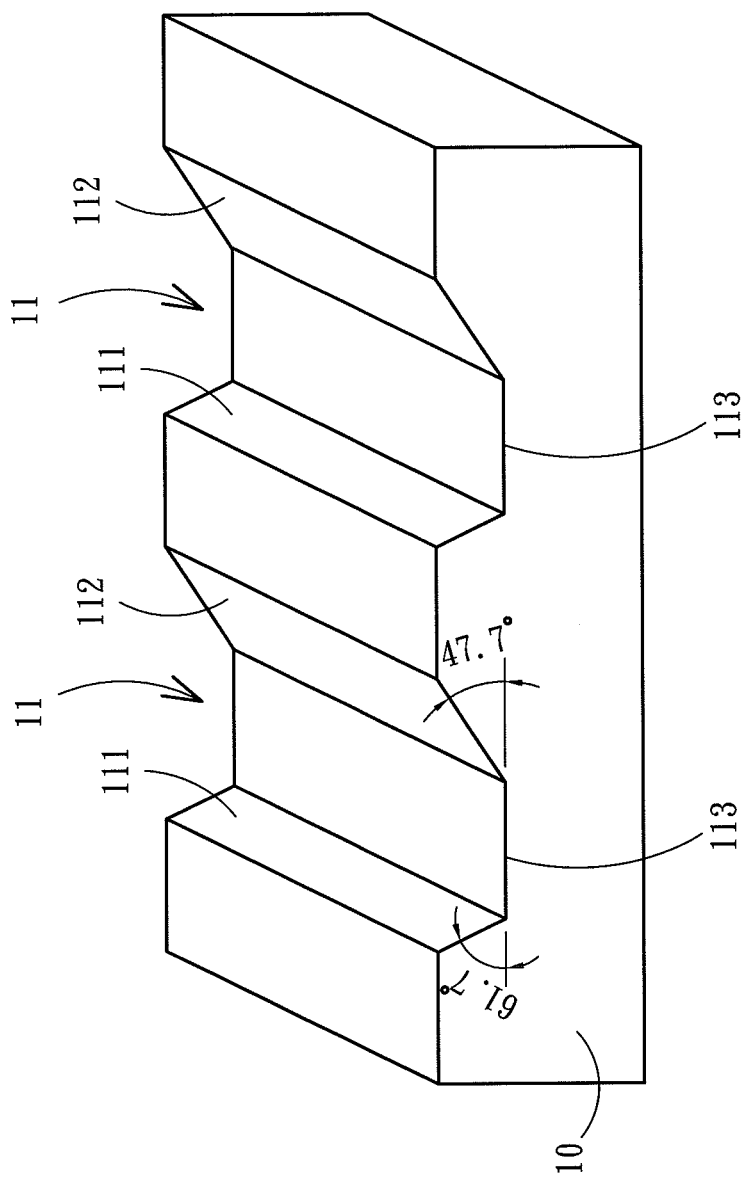

Refer to FIG. 1B. Next, a plurality of parallel discrete trenches 11 is formed on the silicon substrate 10. Each trench 11 has a first wall 111 and a second wall 112. In this embodiment, the silicon substrate 10 revealed by the patterns 50 is etched by using an etching solution to form a plurality of trenches 11 each having a first wall 111, a second wall 112, and a base 113 connecting with the first and second walls 111 and 112. The etching solution is an aqueous solution, such as ammonium hydroxide (NH$_4$OH), potassium hydroxide (KOH), tetramethylammonium hydroxide (TMAH), ethylenediamine pyrocatechol (EDP), hydrazine (N$_2$H$_4$), sodium hydroxide (NaOH), lithium hydroxide (LiOH), and cesium hydroxide (CsOH). The first wall 111 is a (111) crystallographic plane of the silicon substrate 10; in the present invention, the angle formed between the first wall 111 and an extension of the base plane 113 is 58.7-64.7 degrees. In this embodiment, the angle of 61.7 degrees is adopted. The second wall 112 is a (−1-11) crystallographic plane of the silicon substrate 10; in the present invention, the angle formed between the second wall 112 and an extension of the base plane 113 is 44.7-50.7 degrees. In this embodiment, the angle of 47.7 degrees is adopted.

Figure 1C:
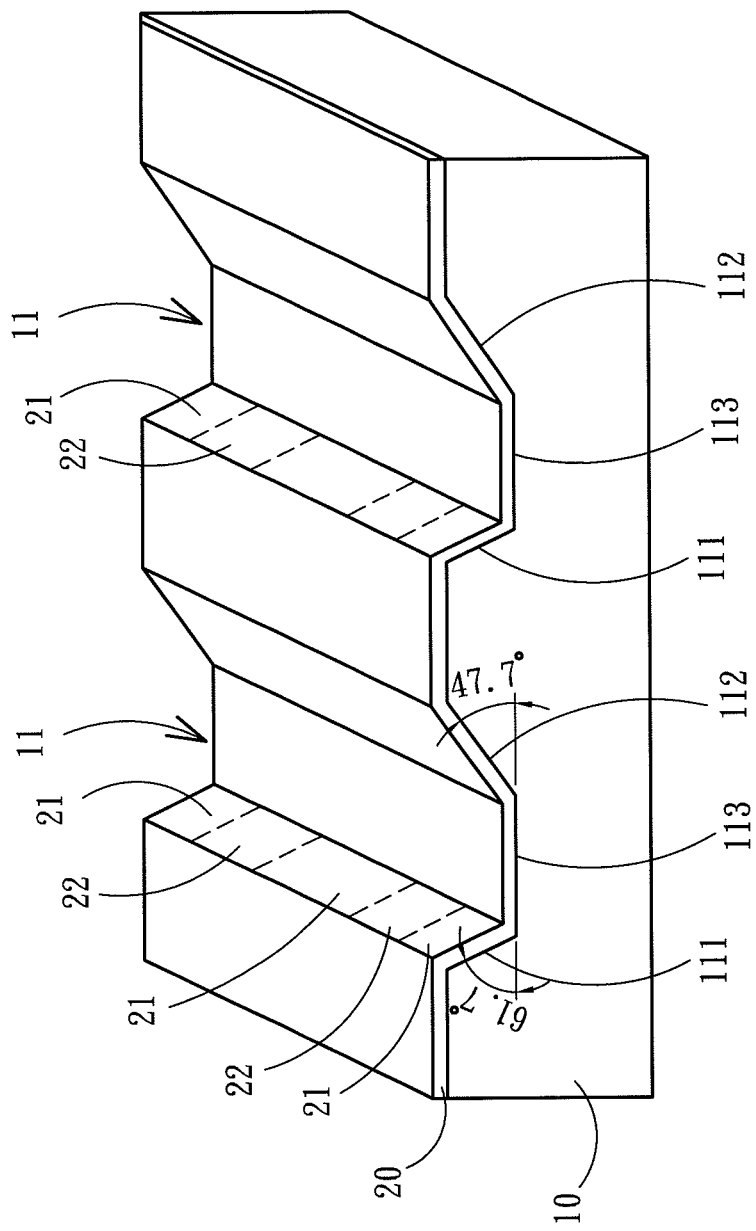

Refer to FIG. 1C. Next, a buffer layer 20 is form on the silicon substrate 10 containing the trenches 11. The buffer layer 20 on each first wall 111 has a plurality of growing zones 21 and a plurality of non-growing zones 22 complementary to the growing zones 21. In this embodiment, hydrofluoric acid or BOE (Buffer Oxidation Etchant) is used to clean the surface of the silicon substrate 10. Then a buffer layer 20 having a thickness of 20-100 nm is grown on the silicon substrate 10. On the first wall 111 covered by the buffer layer 20 are beforehand assigned the growing zones 21 and the non-growing zones 22, wherein the non-growing zones 22 are complementary to the growing zones 21, and wherein one non-growing zone 22 is between two adjacent growing zones 22. In the present invention, the buffer layer 20 is made of a binary, ternary or quaternary compound of gallium nitride, aluminum nitride, or indium nitride. Alternatively, the buffer layer 20 is made of a material whose lattice constants are similar to lattice constants of the abovementioned materials, such as zinc oxide (ZnO). Thereby the stress caused by lattice mismatch between the silicon substrate 10 and a semipolar nitride 40 to be grown on the silicon substrate 10 is reduced. Therefore the epitaxial quality of the semipolar nitride 40 is increased. The buffer layer 20 can be fabricated with the MBE (Molecular Beam Epitaxy) method, the MOCVD (Metal Organic Chemical Vapor Deposition) method, or the hydride vapor phase epitaxy method. Alternatively, the buffer layer 20 is fabricated with a combination of the abovementioned methods. Considering achieving the optimal buffer effect, the buffer layer 20 may be in form of a single-layer structure, a double-layer structure or a multi-layer structure. In this embodiment, the buffer layer 20 is a single-layer aluminum gallium nitride fabricated with MOCVD.

Figure 1D:
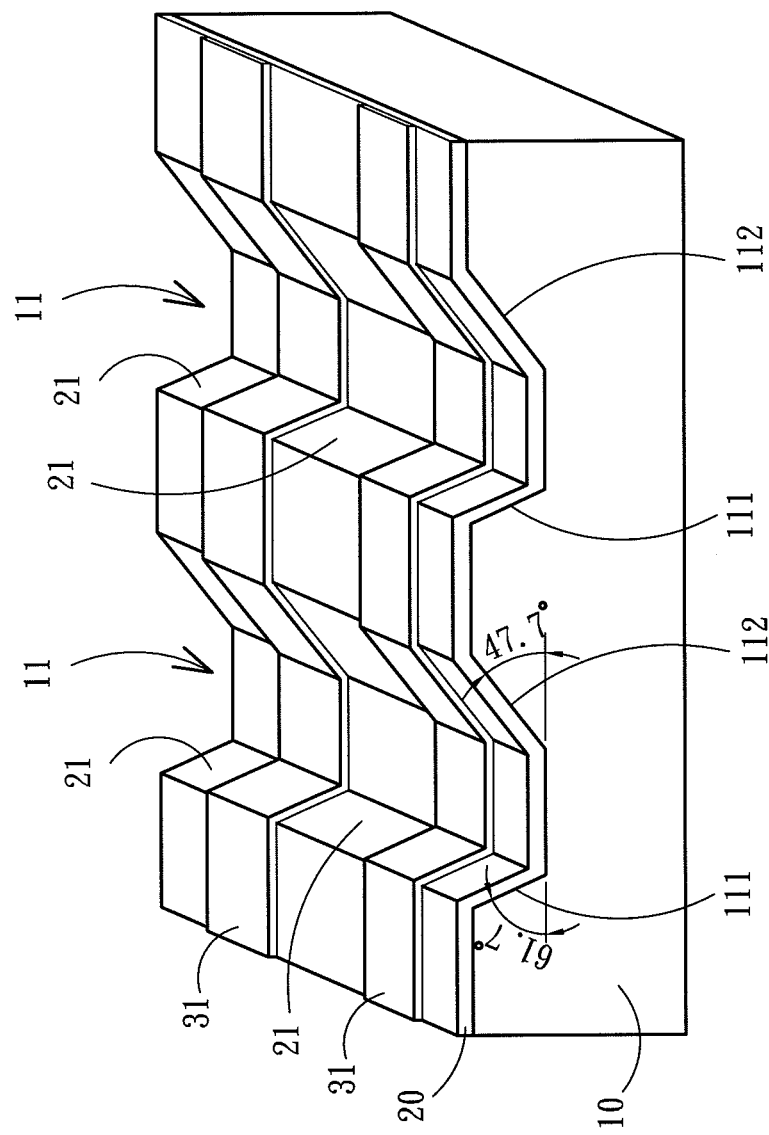
Figure 1E:
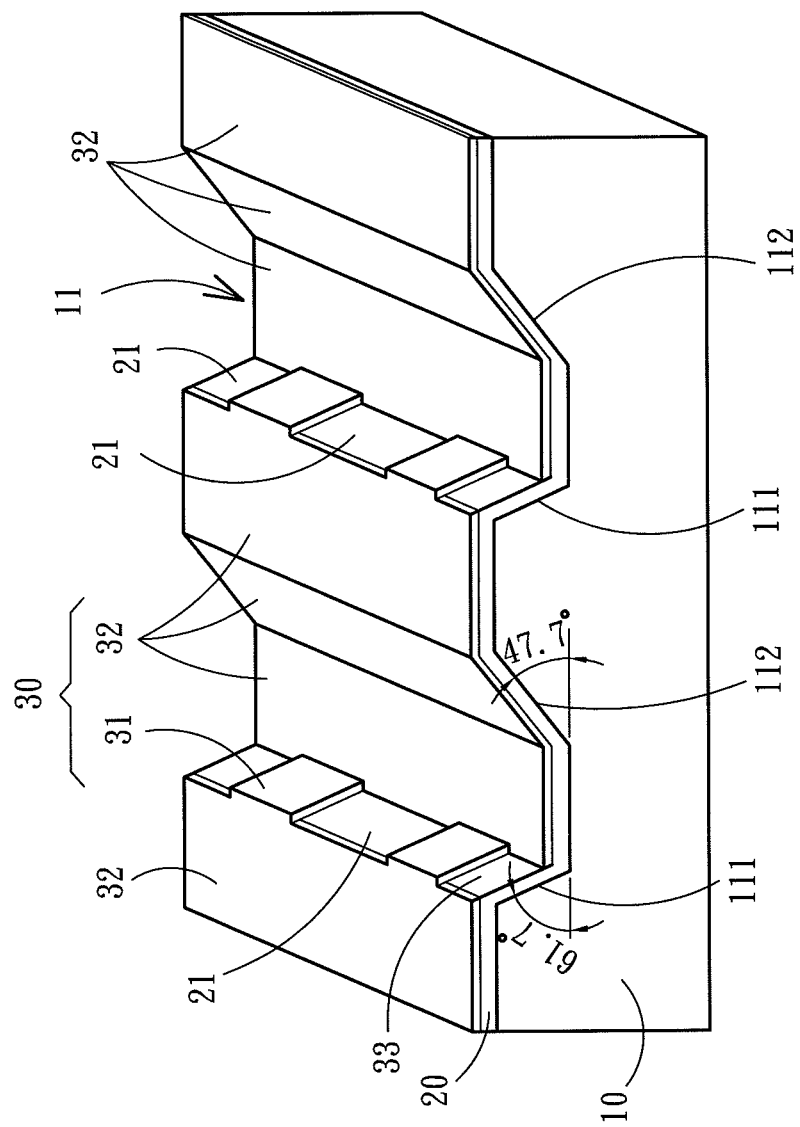

Refer to FIGS. 1D and 1E. After the buffer layer 20 has been formed on the silicon substrate 10, a cover layer 30 is formed on the buffer layer 20 to covers the buffer layer 20 but reveal the growing zones 21. The cover layer 30 includes first cover layers 31 and a second cover layer 32. Firstly, strip-like first cover layers 31 are formed on the buffer layer 20. The length direction of the first cover layers 31 is unparallel to the length direction of the trenches 11. In this embodiment, the length direction of the first cover layers 31 is vertical to the length of the trenches 11. In each first wall 111, the first cover layers 31 cover the non-growing zones 22. After the first cover layers 31 have been established, a second cover layer 32 is formed on the buffer layer 20 on the silicon substrate 10 and the first cover layers 31 on the buffer layer 20. The first cover layer 31 and the second cover layer 32 pile to each other to form a cover layer 30 that merely reveals the growing zones 21. In other words, the cover layer 30 overlays the entire buffer layer 20 except the growing zones 21, and the area between two adjacent growing zones 21 are covered by the first cover layers 31. In this embodiment, each of the first and second cover layers 31 and 32 is made of silicon dioxide or silicon nitride. First, the first cover layer 31 can be defined by a photolithographic process. The length direction of the first cover layer is vertical to the length direction of the trenches 11, with the non-growing zones 22 being covered by the first cover layer 31. Next, the second cover layer 32 is formed to cover the buffer layer 20 but reveal the growing zones 21. In the present invention, the second cover layer 32 may be formed with the PECVD (Plasma Enhancement Chemical Vapor Deposition) method, the E-gun evaporation method, the thermal evaporation deposition method or the ion sputtering method. In this embodiment, the second cover layer 32 is formed with the E-gun evaporation method.

Figure 1F:
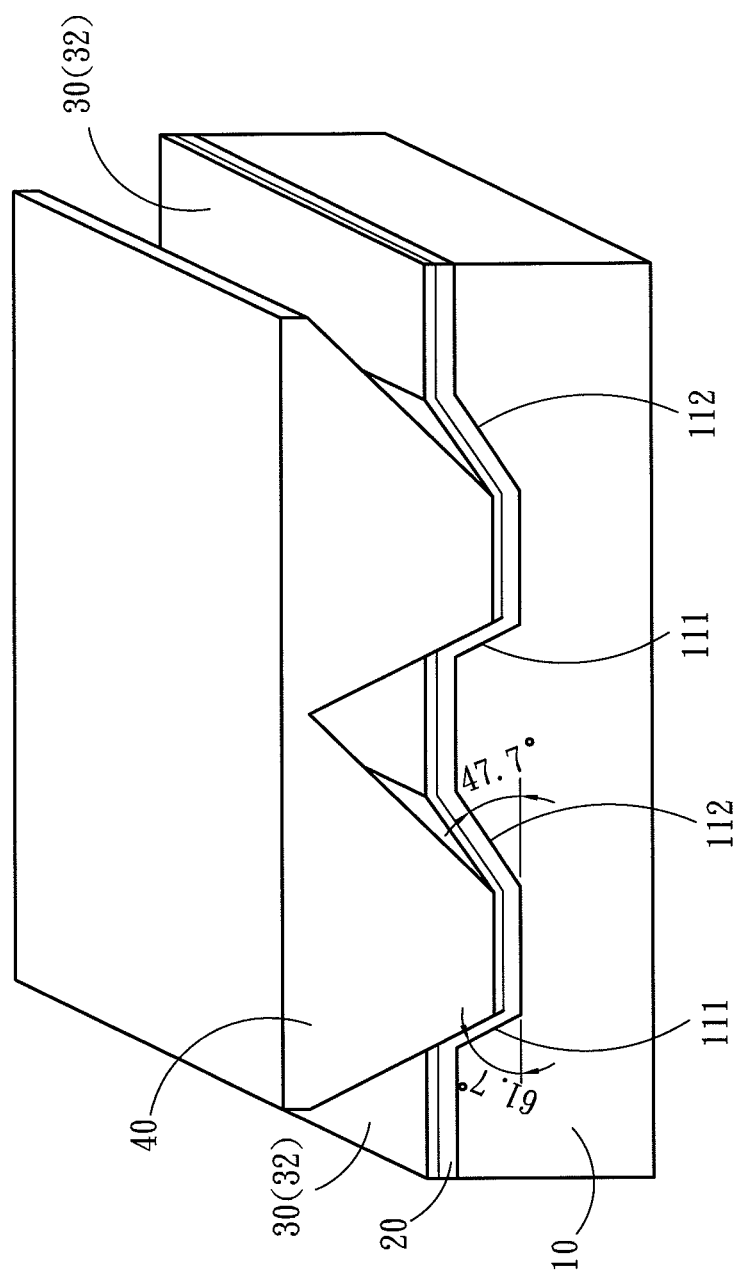

Refer to FIG. 1F. After the cover layer 30 has been formed, a semipolar nitride 40 is grown from the plurality of growing zones 21 to cover the cover layer 30. The semipolar nitride 40 is a binary, ternary or quaternary compound of gallium nitride, aluminum nitride or indium nitride. The semipolar nitride 40 is grown with the MBE (Molecular Beam Epitaxy) method, the MOCVD method, or the chloride VPE (Vapor Phase Epitaxy) method. The epitaxy of the semipolar nitride 40 is started from the plurality of growing zones 21 on the buffer layer 20 and then spread to overlay the cover layer 30. In this embodiment, the semipolar nitride 40 is a semipolar gallium nitride semiconductor layer grown from the plurality of growing zones 21 on the buffer layer 20 by the MOCVD method with the (1-101) crystallographic plane being on the buffer layer 20. As the buffer layer 20 cannot completely buffer the stress caused by lattice mismatch and difference of thermal expansion coefficients between the substrate 10 and the semipolar nitride 40, the cover layer 30 define parts of the buffer layer 20 as the plurality of discrete growing zones 21 where the semipolar nitride 40 starts to grow, whereby the directions of tensile stress caused by lattice mismatch and difference of thermal expansion coefficients are dispersed, wherefore the semipolar nitride cracks caused the tensile stress are decreased.

In conclusion, the present invention is characterized in using a cover layer to define parts of a buffer layer as a plurality of discrete growing zones. Therefore, the area where a semipolar nitride layer is bonded to the buffer layer and the area where the semipolar nitride is grown on the substrate are decreased. Besides, the tensile stress caused by lattice mismatch and difference of thermal expansion coefficients are reduced and the directions of the tensile stress are dispersed. The quality of the semipolar nitride film is increased.

What is claimed is:

1. A method for growing a semipolar nitride, comprising steps:
   forming a plurality of trenches on a silicon substrate, each trench having a first wall and a second wall, wherein a tilt angle is formed between the surface of the silicon substrate and the first wall;
   forming a buffer layer on the silicon substrate and the trenches, wherein the buffer layer on the first wall has a plurality of growing zones and a plurality of non-growing zones among the growing zones and complementary to the growing zones;
   forming a cover layer on the buffer layer, the cover layer covering the non-growing zones but revealing the growing zones; and
   growing a semipolar nitride from the growing zones of the buffer layer such that the semipolar nitride overlay the cover layer.

2. The method for growing a semipolar nitride according to claim 1, wherein the angle between a surface of the silicon substrate and a (001) crystallographic plane of the silicon substrate ranges from 5 degrees to 10 degrees.

3. The method for growing a semipolar nitride according to claim 1, wherein the first wall is a (111) crystallographic plane of the silicon substrate.

4. The method for growing a semipolar nitride according to claim 1, wherein the second wall is a (-1-11) crystallographic plane of the silicon substrate.

5. The method for growing a semipolar nitride according to claim 1, wherein each said trench further comprises a base joined to the first wall and the second wall.

6. The method for growing a semipolar nitride according to claim 1, wherein each of the buffer layer and the semipolar nitride is made of a material selected from a group consisting of gallium nitride, aluminum nitride and indium nitride.

7. The method for growing a semipolar nitride according to claim 1, wherein the semipolar nitride is grown with a MBE (Molecular Beam Epitaxy) method, an MOCVD (MOCVD (Metal Organic Chemical Vapor Deposition) method, or a chloride VPE (Vapor Phase Epitaxy) method.

8. The method for growing a semipolar nitride according to claim 1, wherein the buffer layer has a thickness within a range from 0.5 nm to a depth of the trenches.

9. The method for growing a semipolar nitride according to claim 1, wherein the buffer layer is grown with a MBE (Molecular Beam Epitaxy) method, an MOCVD (MOCVD (Metal Organic Chemical Vapor Deposition) method, or a chloride VPE (Vapor Phase Epitaxy) method.

10. The method for growing a semipolar nitride according to claim 1, wherein the cover layer is made of silicon dioxide or silicon nitride.

* * * * *